US012120823B2

(12) United States Patent
Chahine et al.

(10) Patent No.: US 12,120,823 B2
(45) Date of Patent: Oct. 15, 2024

(54) METHOD OF MANUFACTURING TEXTILE WITH CONDUCTIVE YARNS AND INTEGRATED ELECTRONICS

(71) Applicant: MYANT INC., Toronto (CA)

(72) Inventors: Tony Chahine, Toronto (CA); Godfried Gysbrecht Edelman, Toronto (CA); Sahar Golmohammadi Rostami, Toronto (CA); Christopher Robin Leiphart, Toronto (CA)

(73) Assignee: MYANT INC., Toronto (CA)

( * ) Notice: Subject to any disclaimer, the term of this patent is extended or adjusted under 35 U.S.C. 154(b) by 295 days.

(21) Appl. No.: 17/787,076

(22) PCT Filed: Dec. 18, 2020

(86) PCT No.: PCT/CA2020/051747
§ 371 (c)(1),
(2) Date: Jun. 17, 2022

(87) PCT Pub. No.: WO2021/119828
PCT Pub. Date: Jun. 24, 2021

(65) Prior Publication Data
US 2023/0044571 A1    Feb. 9, 2023

Related U.S. Application Data

(60) Provisional application No. 62/949,859, filed on Dec. 18, 2019.

(51) Int. Cl.
*D04B 1/12*    (2006.01)
*D06N 3/10*    (2006.01)
(Continued)

(52) U.S. Cl.
CPC ............... *H05K 1/189* (2013.01); *D04B 1/12* (2013.01); *D06N 3/106* (2013.01); *H05K 1/038* (2013.01); *H05K 1/181* (2013.01); *H05K 3/3442* (2013.01); *D06N 2209/041* (2013.01); *D10B 2401/16* (2013.01); *D10B 2401/18* (2013.01); *D10B 2403/02431* (2013.01); *H05K 2201/0281* (2013.01); *H05K 2203/0285* (2013.01)

(58) Field of Classification Search
CPC ............................... D04B 1/12; H05K 3/3442
See application file for complete search history.

(56) References Cited

U.S. PATENT DOCUMENTS

2005/0156015 A1    7/2005  Jayaraman et al.
2008/0196783 A1    8/2008  Van Bruggen et al.
(Continued)

OTHER PUBLICATIONS

European Search Opinion dated Feb. 7, 2024 for EP 20903384.4.
International Search Report and Written Opinion dated Feb. 24, 2021 to PCT Application No. PCT/CA2020/051747.

*Primary Examiner* — Jeremy C Norris
(74) *Attorney, Agent, or Firm* — Norton Rose Fulbright Canada LLP

(57) ABSTRACT

Methods for manufacturing a textile article having conductive yarn and an integrated electronic device are disclosed. An embodiment of the method includes receiving computer-readable instruction indicative of a knitting pattern of the textile article. Based on the instructions, a textile is formed by knitting conductive yarn and non-conductive yarn. A weld is applied at a junction where two or more conductive paths meet to create a bond between the two or more conductive paths.

20 Claims, 12 Drawing Sheets

(51) Int. Cl.
    *H05K 1/03*           (2006.01)
    *H05K 1/18*           (2006.01)
    *H05K 3/34*           (2006.01)

(56) References Cited

U.S. PATENT DOCUMENTS

| | | |
|---|---|---|
| 2013/0176737 A1 | 7/2013 | Zhou et al. |
| 2014/0343390 A1 | 11/2014 | Berzowska et al. |
| 2017/0056644 A1 | 3/2017 | Chahine et al. |
| 2019/0373724 A1 | 12/2019 | Gouthez et al. |

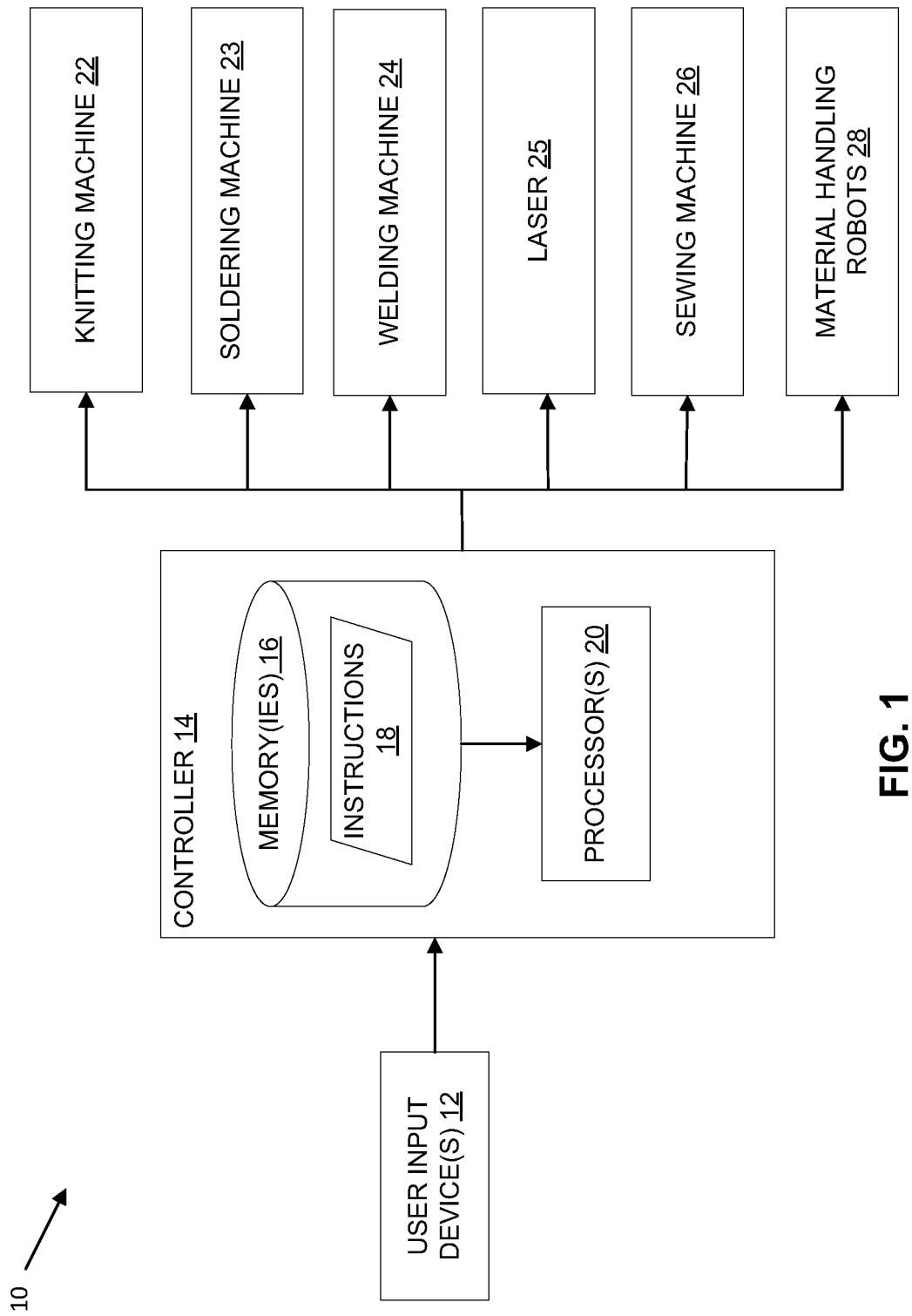

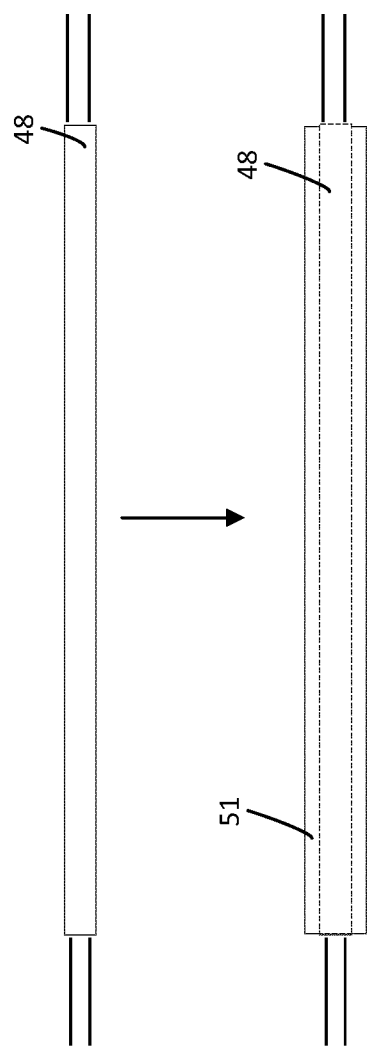

METHOD OF MANUFACTURING TEXTILE WITH CONDUCTIVE YARNS AND INTEGRATED ELECTRONICS

CROSS-REFERENCE TO RELATED APPLICATIONS

This application claims all benefit including priority to U.S. Provisional Patent Application 62/949,859, filed Dec. 18, 2019, and entitled "METHOD OF MANUFACTURING TEXTILES WITH INTEGRATED ELECTRICAL PATHS AND ELECTRONICS"; the entire contents of which are hereby incorporated by reference herein.

FIELD

The disclosure relates generally relates to textiles, and more particularly to manufacturing textiles having integrated electronics.

BACKGROUND

Conductive yarn incorporated within textile articles transmit electrical signals between conductive paths and/or electronic devices. Due to the flexibility of textiles, a textile article may be subjected to loading such as stretching or bending without damaging the textile article. However, if the textile article has conductive yarn and integrated electronic devices, when the textile article is subjected to loading, depending on the type of loading and/or the degree of loading, connection points between adjoining conductive paths or an electronic device and a conductive path may break. Current processes of connecting conductive paths and integrating electronic devices in a textile article also rely heavily on materials such as glue or clips. Improvement is desired.

SUMMARY

In an aspect, there is provided a computer-aided method for manufacturing a textile article having electrically conductive yarn and an integrated electronic device. The method includes receiving computer-readable instructions indicative of a knitting pattern of the textile article, the knitting pattern defining: an arrangement of conductive yarn and non-conductive yarn in the textile article, the conductive yarn arranged to provide a plurality of conductive paths; a location of a junction where two or more of the plurality of conductive paths meet; and a location of an end of a given one of the conductive paths. The method also includes processing the computer-readable instructions and in accordance with the instructions: form the textile article by knitting the conductive yarn and the non-conductive yarn; apply a weld at the junction to create a bond between the conductive paths that meet at the junction; place the electronic device on the textile article at a location where a terminal of the electronic device is proximate the end of the given conductive path; and apply a weld at the end of the given conductive path to create a bond between the end of given conductive path and the terminal of the electronic device.

In accordance with another aspect, there is provided a computer-aided method for manufacturing a textile article having electrically conductive yarn. The method includes receiving computer-readable instructions indicative of a knitting pattern of the textile article, the knitting pattern defining: an arrangement of conductive yarn and non-conductive yarn in the textile article, the conductive yarn arranged to provide a plurality of conductive paths; and a location of a junction where two or more of the plurality of conductive paths meet. The method also includes processing the computer-readable instructions and in accordance with the instructions: form the textile article by knitting the conductive yarn and the non-conductive yarn; and apply a weld at the junction to create a bond between the conductive paths that meet at the junction.

In accordance with yet another embodiment, there is provided a system for manufacturing a textile article having conductive yarn and an integrated electronic device. The system includes a knitting machine; at least one ultrasonic welding machine; a material handling robot; one or more processors; non-transitory machine-readable memory storing instructions executable by the one or more computer processors and configured to cause the one or more computer processors to: receive manufacturing instructions indicative of a knitting pattern of the textile article, the knitting pattern defining: an arrangement of conductive yarn and non-conductive yarn in the textile article, the conductive yarn arranged to provide a plurality of conductive paths; a location of a junction where two or more of the plurality of conductive paths meet; and a location of an end of a given one of the conductive paths; and process the manufacturing instructions and in accordance with the manufacturing instructions: determine first operating parameters for the knitting machine, second operating parameters for the at least one welding machine, third operating parameters for the material handling robot; and fourth operating parameters for the at least one welding machine; configure the knitting machine to form the textile article by knitting the conducting yarn and the non-conductive yarn when operating under the first operating parameters; configure the at least one welding machine to apply high-frequency ultrasonic acoustic vibration at the junction when operating under the second operating parameters; configure the material handling robot to place the electronic device on the textile article at a location where a terminal of the electronic device is proximate the end of a given one of the conductive paths when operating under the third operating parameters; and configure the at least one welding machine to apply a weld at the junction to create a bond between the terminal of the electronic device and the given one of the conductive paths when operating under the fourth operating parameters.

Further details of these and other aspects of the subject matter of this application will be apparent from the detailed description included below and the drawings.

DESCRIPTION OF THE DRAWINGS

Reference is now made to the accompanying drawings, in which:

FIG. 1 is a schematic diagram of an example system for manufacturing a textile article having conductive yarn and an integrated electronic device, in accordance with an embodiment;

FIG. 8 is a front view of a sensor before and after an overmolding process, in accordance with an embodiment;

DETAILED DESCRIPTION

Figure 2A:
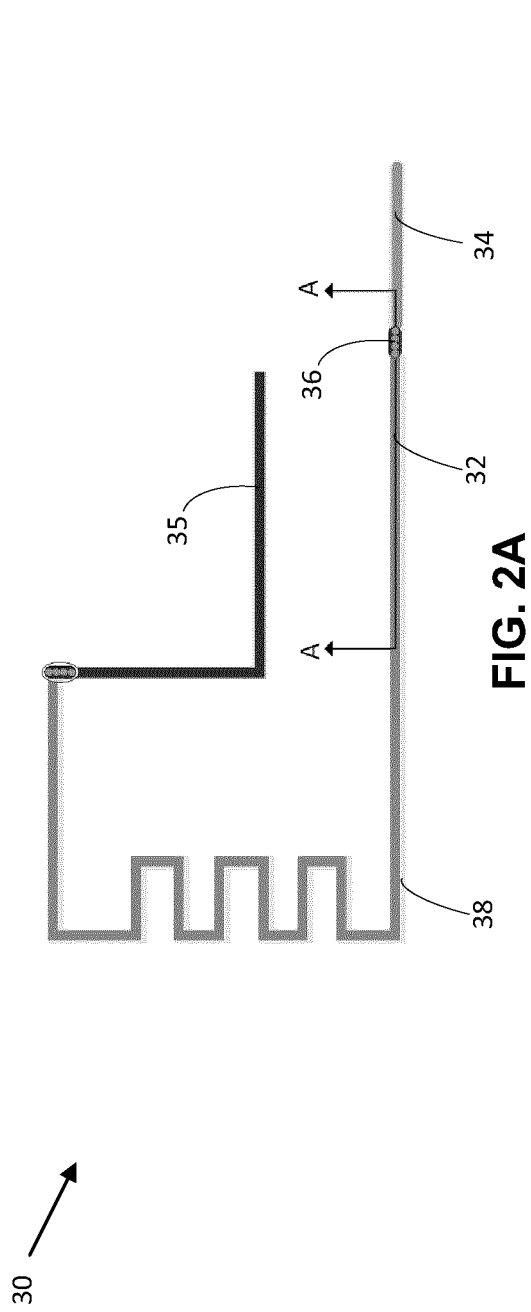
FIG. 2A is a top plan view of an arrangement of conductive paths incorporated in a textile article, in accordance with an embodiment.

The following description discloses systems and methods useful manufacturing textiles with electrically conductive yarn and integrated electronics. The textile article manufactured using the methods and systems described herein may have electrically conductive yarn and integrated electronic device(s) that maintain electrical connections when the textile article is subjected to loading (e.g. stretching, bending). Such electrical connections may be used for transmitting data and/or power throughout the textile and to/from integrated electronics. In some embodiments, the methods disclosed herein include applying welds between adjoining conductive paths and between an end of a conductive path and a electronic device. The methods disclosed herein may be applied to integrate various types of electronic devices including various sensors, actuators, transmitters, printed circuit boards, or the like, or components thereof.

Aspects of various embodiments are described through reference to the drawings.

FIG. 1 is a schematic diagram of a system 10 used for manufacturing a textile article having electrically conductive yarn and one or more integrated electronic devices, in accordance with an embodiment. System 10 may include controller 14 and one of more user input devices 12 (referred hereinafter in the singular). Controller 14 may be configured to receive input from user input device 12 via one or more communication terminals/ports.

Controller 14 may include one or more data processors 20 (referred hereinafter in the singular) and one or more computer-readable memories 16 (referred hereinafter in the singular) storing machine-readable instructions 18 executable by data processor 20 and configured to cause data processor 20 to generate one or more outputs (e.g., signals) for causing the execution of one or more steps of the methods described herein.

Data processor 20 may include any suitable device(s) configured to cause a series of steps to be performed by controller 14 so as to implement a computer-implemented process such that instructions 18, when executed by controller 14 or other programmable apparatus, may cause the functions/acts specified in the methods described herein to be executed. Data processor 20 may include, for example, any type of general-purpose microprocessor or microcontroller, a digital signal processing (DSP) processor, an integrated circuit, a field programmable gate array (FPGA), a reconfigurable processor, other suitably programmed or programmable logic circuits, or any combination thereof.

Memory 16 may include any suitable machine-readable storage medium. Memory 16 may include non-transitory computer readable storage medium such as, for example, but not limited to, an electronic, magnetic, optical, electromagnetic, infrared, or semiconductor system, apparatus, or device, or any suitable combination of the foregoing. Memory 16 may include a suitable combination of any type of computer memory that is located either internally or externally to controller 14. Memory 16 may include any storage means (e.g. devices) suitable for retrievably storing machine-readable instructions 18 executable by data processor 20.

User input device 12 may be a computing device having a graphical user interface (GUI) such as a desktop computer, laptop computer or a mobile device such as a tablet for example. User input device 12 may be configured to receive user inputs from an operator. In some embodiments, controller 14 may be part of user input device 12. The user input may include computer-readable instructions related to a desired knitting pattern for a textile article.

The computer-readable instructions may be manufacturing instructions on how to construct the textile article. The textile article may comprise non-conductive yarn, conductive yarn and at least one electronic device integrated within the textile article. The computer-readable instructions may indicate an arrangement of the conductive yarn and the non-conductive yarn in the textile article. The conductive yarn may be arranged to provide a plurality of conductive paths. The computer-readable instructions may indicate the material of the non-conductive yarn and the material of the conductive yarn that is used to manufacture the textile article. Conductive yarn may be an alloy of various metals, e.g., including copper, silver, tin, nickel, and other metals. The computer-readable instructions may indicate a location where two or more of the plurality of conductive paths meet. This location may be on an outer layer of the textile article. The computer-readable instructions may further indicate a location of an end of a given one of the conductive paths. This location may be on an inner layer of the textile article.

Controller 14 may be configured to process the computer-readable instructions to determine a set of operating parameters for one or more machines. Controller 14 may be further configured to generate a plurality of signals indicative of the determined operating parameters for the one or more machines. Controller 14 may be configured to transmit each signal of the plurality of signals to a respective machine of the one or more machines via the one or more communication terminals/ports. The one or more machines may include knitting machine 22, soldering machine 23, welding machine 24, laser 25, sewing machine 26 and material handling robot 28. In some embodiments, some of these machines may be successively arranged and a conveyor may be used to convey a textile article between the machines.

Knitting machine 22 may be configured to receive one or more signals indicative of operating parameters for knitting machine 22 from controller 14. Knitting machine 22 may be a computerized flat bed knitting machine. Knitting machine 22 may include or be communicatively coupled with one or more data processors and one or more computer-readable memories storing machine-readable instructions executable by the one or more data processors. In some embodiments, the transmission of the one or more signals from controller 14 to knitting machine 22 may be instructed by the one or more data processors of knitting machine 22. In response to receiving the one or more signals, knitting machine 22 may be configured to operate under the defined operating parameters set out in the one or more signals received. When operating under these operating parameters, knitting machine 22 may be configured to form a textile article by knitting conductive yarn and non-conductive yarn in accordance with a desired knitting pattern received from user input device 12.

Soldering machine 23 may be configured to receive one or more signals indicative of operating parameters for soldering machine 23 from controller 14. Soldering machine 23 may be a robotic soldering machine. Soldering machine 23 may include or be communicatively coupled with one or more data processors and one or more computer-readable memories. In some embodiments, the transmission of the one or more signals from controller 14 to soldering machine 23 may be controlled by the one or more data processors of soldering machine 23. For instance, data processor may command the one or more signals from controller 14 in response to detection of a textile article in an operating region of soldering machine 23. In response to receiving the one or more signals, soldering machine 23 may be configured to apply solder paste at specified locations on textile article.

In some embodiments, soldering machine 23 may apply solder paste on the textile article at a location that two or more conductive paths meet and/or a location of an end of a given conductive path. In some embodiments, there may be two or more soldering machines 23. One of soldering machines 23 may apply solder paste on the textile article at a location that two or more conductive paths meet and another one of soldering machines 23 may apply solder paste at a location of an end of a given conductive path.

Welding machine 24 may be configured to receive one or more signals indicative of operating parameters for welding machine 24 from controller 14. Welding machine may be an ultrasonic welding machine that includes a user interface, ultrasonic generator, a machine stand (consisting of the base-plate, pneumatic system and welding press), a welding stack (incorporates the ultrasonic transducer, booster and welding horn) and a component holding fixture. Ultrasonic welding machine may use high-frequency mechanical vibrations to soften or melt a metal or thermoplastic material at a joint to create a solid-state weld. The mechanical energy is converted to thermal energy due to intermolecular and surface friction. Welding machine 24 may include or be communicatively coupled with one or more data processors and one or more computer-readable memories. In some embodiments, the transmission of the one or more signals from controller 14 to welding machine 24 may be controlled by the one or more data processors of welding machine 24. For instance, the one or more data processors may command the one or more signals from controller 14 in response to detection of a textile article in a operating region of welding machine 24.

In some embodiments, welding machine 24 may apply pressure and vibration on a textile article at a location that two or more conductive paths meet and at an end of a given conductive path. In an alternative embodiment, there may be two or more welding machines 24. One of welding machines 24 may apply pressure and vibration at a location that two or more conductive paths meet and another welding machine of welding machines 24 may apply pressure and vibration at an end of a given conductive path.

Figure 11:
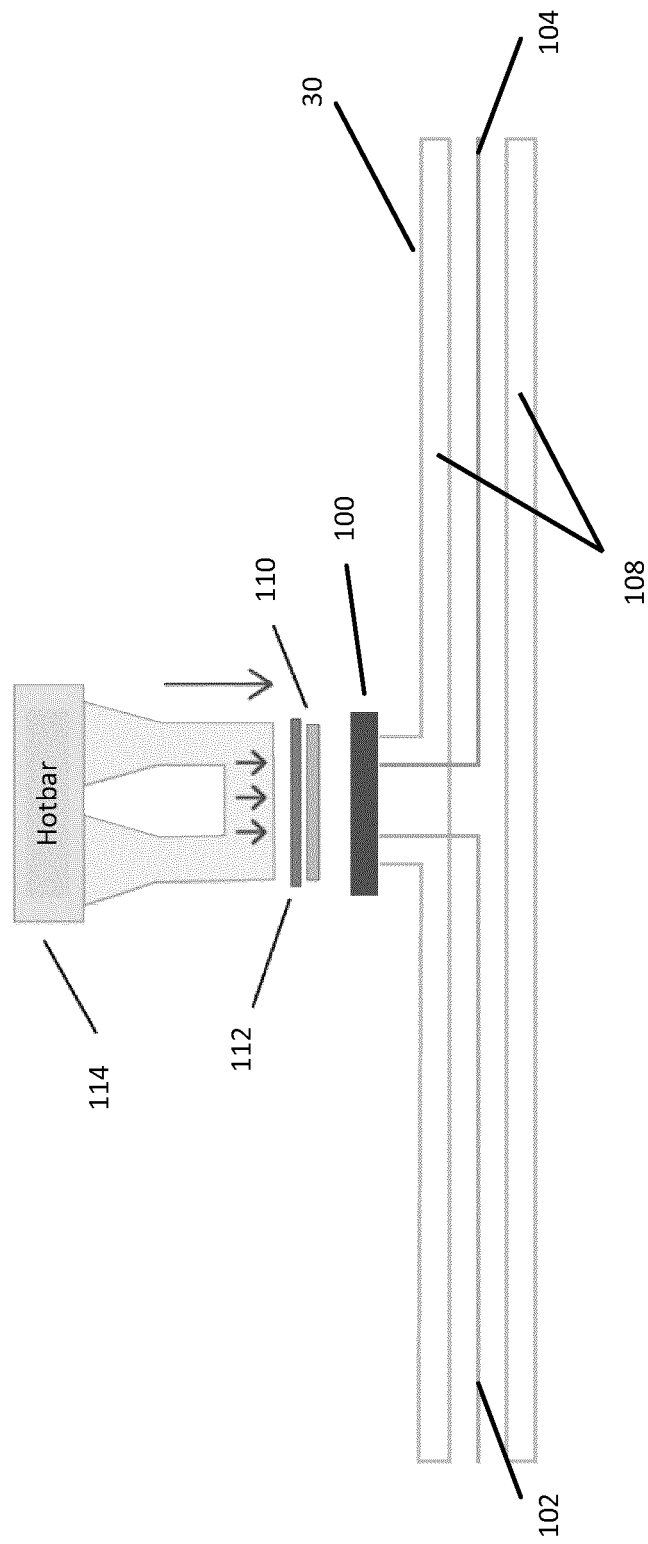
FIG. 11 depicts the conductive tab of FIG. 10 during manufacture of a textile article, in accordance with an embodiment.

In some embodiments, welding machine 24 may apply pressure and heat on a textile article at a given location. In some cases, welding machine 24 may include a hotbar 114 as shown in FIG. 11. Hotbar 114 may be pressed into electronic componentry and solder to weld the electronic componentry to a conductive path. Hotbar 114 may be formed of a metal or other suitable material.

In some embodiments, sewing machine 26 may be configured to receive one or more signals indicative of operating parameters for sewing machine 26 from controller 14. Sewing machine 26 may include or be communicatively coupled to one or more data processors and one or more computer-readable memories. In some embodiments, the transmission of the one or more signals from controller 14 to sewing machine 26 may be controlled by the one or more data processors of sewing machine 26. For instance, data processor may command the one or more signals from controller 14 in response to detection of a textile article in proximity to an operating region of sewing machine 26. In response to receiving the one or more signals, sewing machine 24 may be configured to sew the textile article into a predefined shape in accordance with input provided by user input device 12. Sewing machine 26 may sew the textile article to be of a shape defined in the computer-readable instructions.

Material handling robot 28 may be configured to receive one or more signals indicative of operating parameters for material handling robot 28 from controller 14. Material handling robot 28 may place one or more electronic devices on a textile article to be electrically coupled to conductive yarn of the textile article. In some cases, material handling robot 28 may place the electronic device on the textile article at a location where a terminal of the electronic device is proximate an end of a given one of the conductive paths. In some embodiments, the textile article may be sewn before an electronic device is placed on the textile article.

FIG. 2A depicts a top plan view of an arrangement of conductive paths 32, 34 and 35 incorporated in textile article 30. Textile article 30 may be manufactured using knitting machine 22. Textile article 30 may have a plurality of conductive paths that are electrically connected and that transmit electrical signals to one or more electronic devices. As depicted, conductive paths 32, 34 and 35 may covered by non-conductive yarn 38. As depicted, conductive paths 32 and 34 may be electrically connected at junction 36.

Figure 2B:
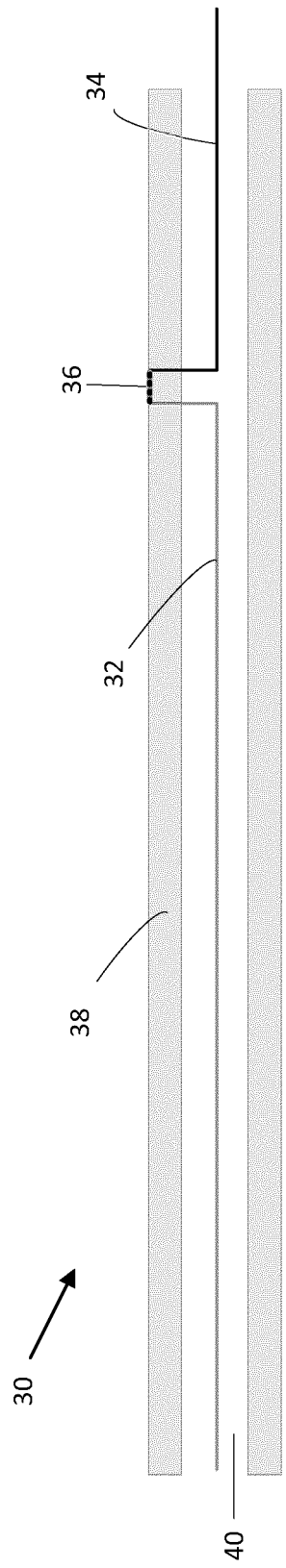
FIG. 2B is a cross-sectional view of a portion of a textile article taken at A-A of FIG. 2A, in accordance with an embodiment.
Figure 3B:
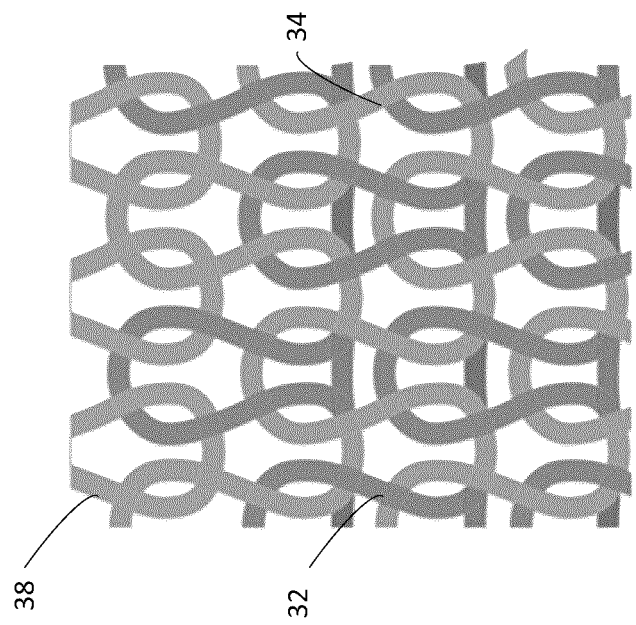
FIGS. 3A and 3B each is a top view of a junction on an outer layer of a textile article having conductive yarn knitted together to form the junction, in accordance with an embodiment.
Figure 3A:
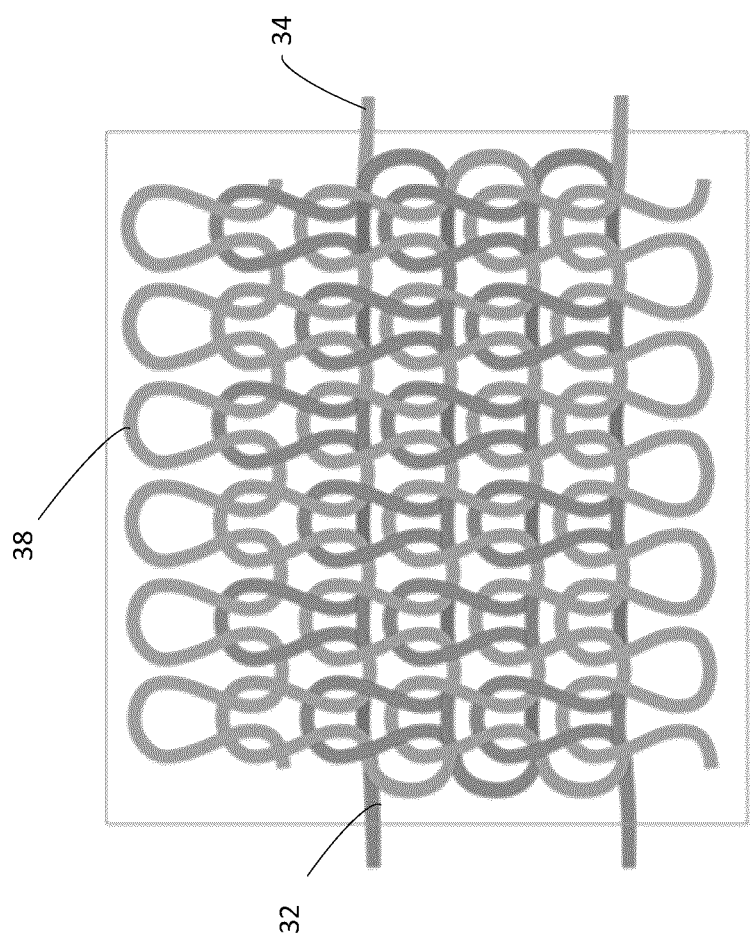

FIG. 2B depicts a cross-sectional view of a portion of textile article 30 taken at A-A of FIG. 2A. Textile article 30 may be formed to include a plurality of layers including at least two outer layers and inlay channel 40 between the two outer layers. Textile article 30 may include an inlay channel 40 between layers of non-conductive yarn 38. Inlay channel 40 may define a path for conductive yarn of textile article 30. As depicted, at least a portion of conductive paths 32 and 34 may be formed within inlay channel 40 and may be covered by non-conductive yarn 38. Another portion of conductive paths 32 and 34 may protrude through one or more layers of non-conductive yarn 38 and form part of an outer layer of textile article 30. As depicted in FIGS. 3A and 3B, conductive paths 32 and 34 may be knitted together at junction 36 on the outer layer of textile 30. The intertwined arrangement of conductive paths 32 and 34 may assist in preventing unwanted separation of conductive paths 32 and 34 from one another.

Figure 4:
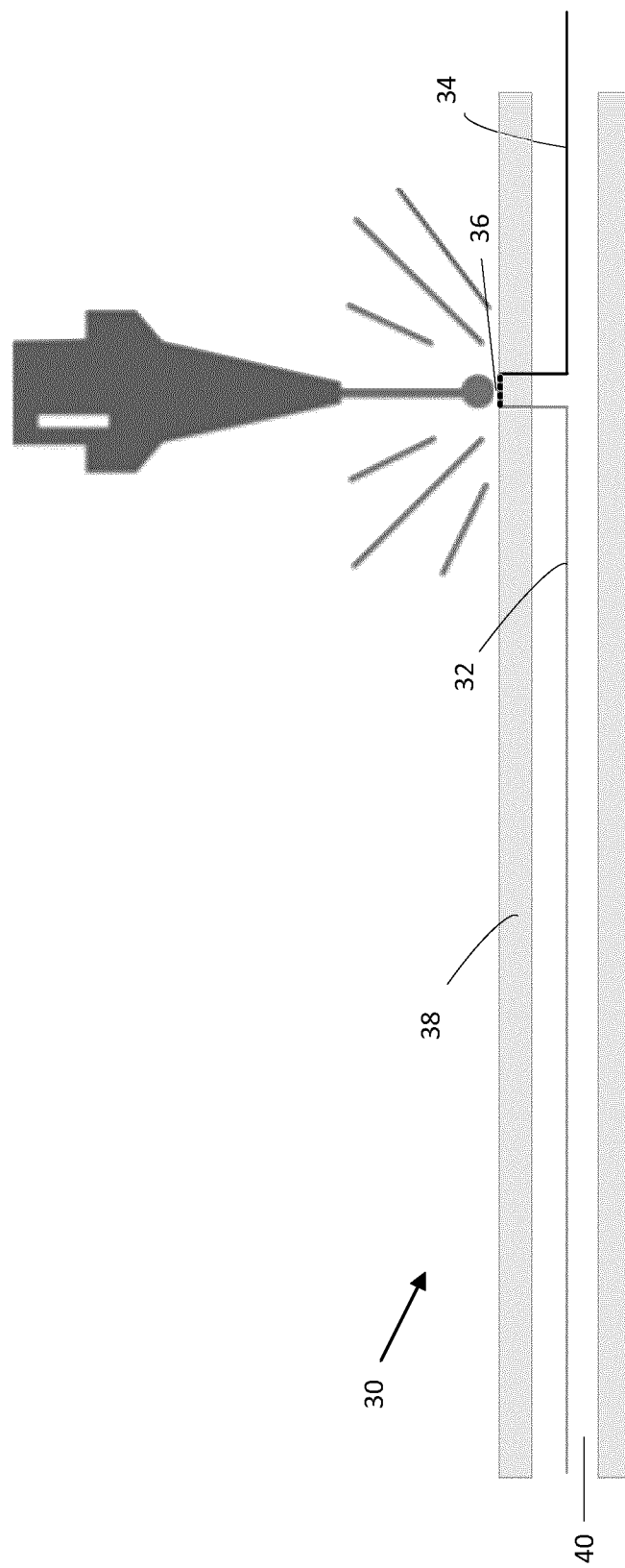
FIG. 4 is a front view of a laser emitting light on a textile article at a junction where two or more conductive paths meet, in accordance with an embodiment.

FIG. 4 depicts a front view of laser 25 emitting light at junction 36 of textile article 30. A cross-section of textile article 30 is depicted for illustrative purposes only. In some cases, conductive yarn integrated in textile article 30 may be coated with insulating material for safety purposes. However, removal of the insulating material may be required at electrical connection points to enable transmission of electrical signals. As depicted, conductive paths 32 and 34 may have insulating material removed at junction 36 to enable transmission of electrical signals between conductive paths 32 and 34. In addition, removing insulating material from conductive paths 32 and 34 at junction 36 may be required to enable subsequent operations to be performed.

Figure 7A:
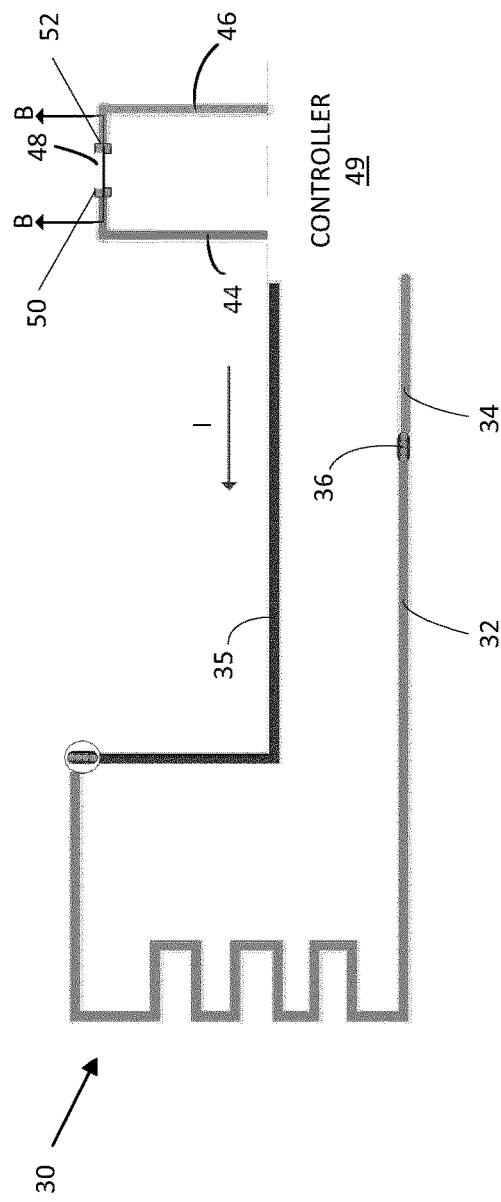
FIG. 7A is a top plan view of conductive paths of a textile article and a controller and sensor integrated in the textile article, in accordance with an embodiment.
Figure 7B:
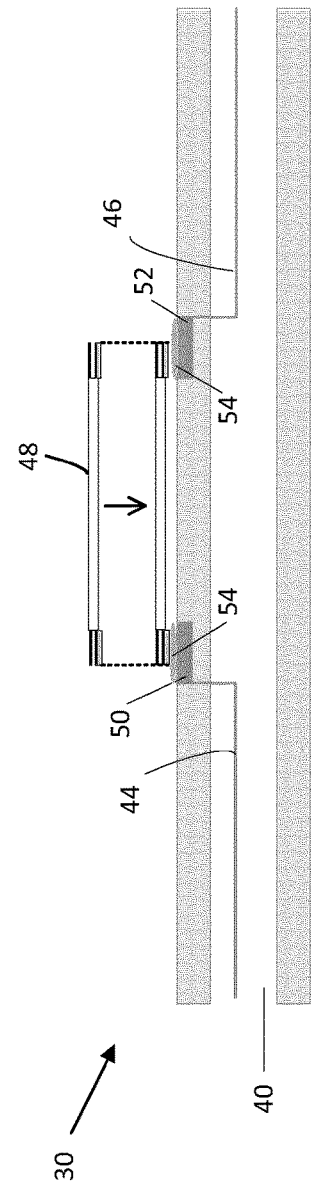
FIG. 7B is a cross-sectional view of a portion of a textile article taken at B-B of FIG. 7A, in accordance with an embodiment.

Laser 35 may be used to remove at least some insulating material coated on conductive yarn. As depicted, high-intensity light emitted from laser 25 may heat insulating material to strip insulating material from conductive paths 32 and 34 at junction 36 without damaging the yarn of textile article 30. Although it is not depicted in FIG. 4, insulating material coated at an end of a given conductive path of textile article 30 may also be removed using laser 25. For example, insulating material wrapped around an end of conductive paths 44 and 46 may be removed to allow electrical coupling with sensor 48 (as shown in FIGS. 7A-7B).

Figure 5:
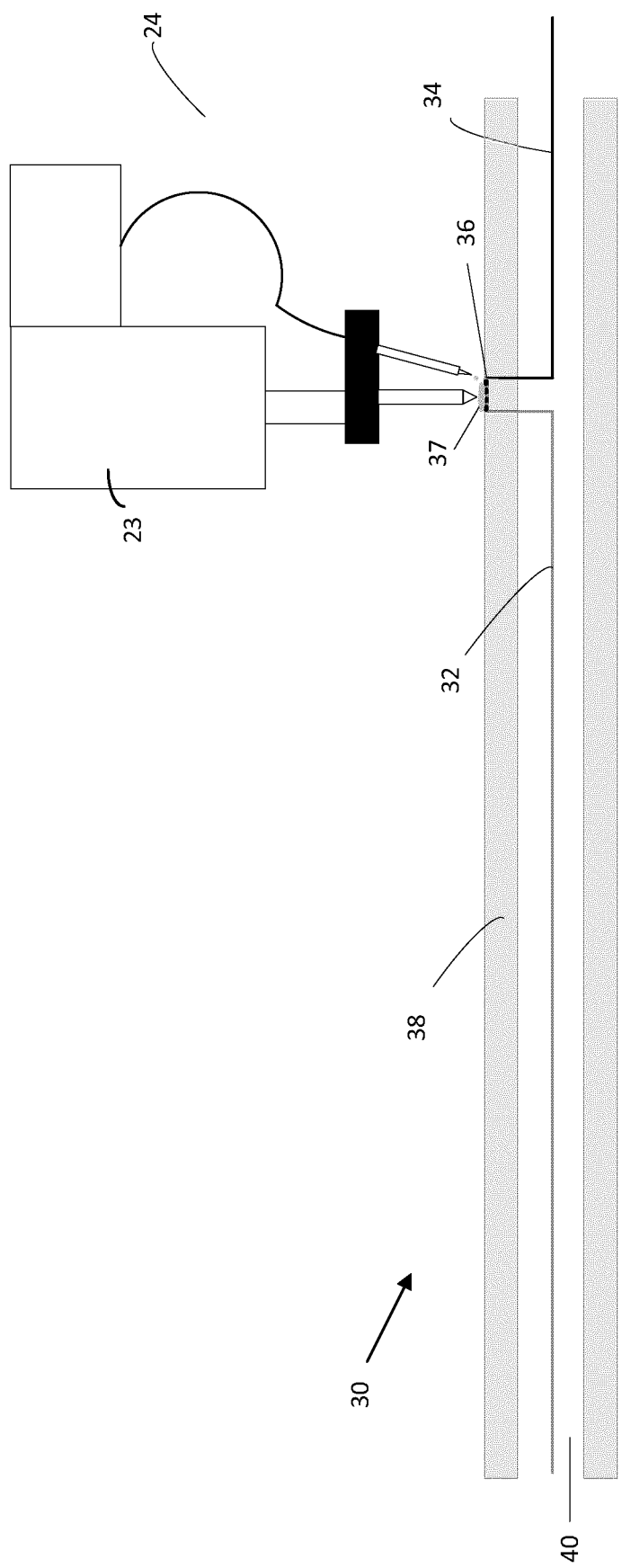
FIG. 5 is a front view of a soldering machine applying solder paste on a textile article, in accordance with an embodiment.

FIG. 5 depicts a front view of soldering machine 23 applying solder paste 37 on textile article 30 at junction 36. A cross-section of textile article 30 is depicted for illustrative purposes. Soldering machine 23 may apply low temperature solder paste 37 at junction 36. Solder paste 37 may be heated and melted to establish a bond between conductive paths 32 and 34 in subsequent processes.

Figure 6:
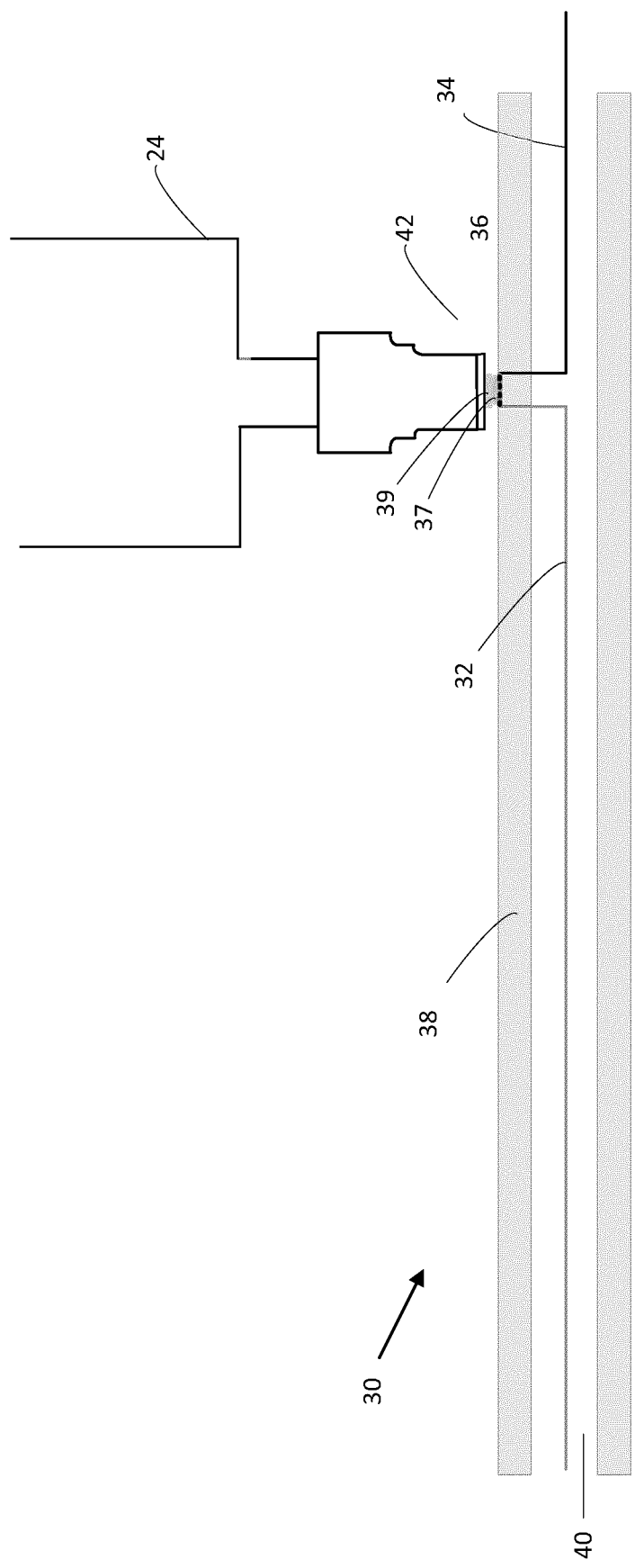
FIG. 6 is a front view of a textile article being welded by welding machine, in accordance with an embodiment.

FIG. 6 depicts a front view of textile article 30 being welded by welding machine 24. A cross-section of textile article 30 is depicted for illustrative purposes only. As depicted, solder paste 37 has been applied at junction 36 and a layer of conductive material 39 has been placed at junction 36. Conductive layer 39 may be one or more layers of copper tape. Copper tape may be placed at junction 36 using a robotic tape applicator for example. In another embodiment, conductive layer 39 may be one or more layers of conductive glue. The conductive glue may be deposited at junction 36 using a robotic dispensing system for example. Welding machine 24 may apply high-frequency ultrasonic acoustic vibration at junction 36 to melt solder paste 37 and conductive layer 39 to create a bond between conductive paths 32 and 34. So bonded, conductive paths 32 and 34 are in electrical communication. Such bonds may be highly resistant to separation, e.g., mechanical forces acting to separate conductive paths 32 and 34.

It should be understood that other types of welding machines may be used to create the bond between conductive paths 32 and 34 such as laser beam welding and spot welding for example.

FIG. 7A depicts a top plan view of conductive paths 32, 34, 35, 44, 46, controller 49 and sensor 48 of textile article 30. In the depicted embodiment, textile article 30 may be a carpet and conductive path 32 may be arranged to provide resistive/joule heating of carpet. Sensor 48 may be a flexible film temperature sensor used to monitor the temperature of the carpet. Sensor 48 may be electrically coupled to respective ends 50 and 52 of conductive paths 44 and 46, respectively.

FIG. 7B depicts a cross-sectional view of a portion of textile article 30 taken at B-B of FIG. 7A. A portion of conductive paths 44 and 46 may be covered by outer layers of textile article 30 and may be arranged within inlay channel 40. As depicted, another portion of conductive paths 44 and 46 may protrude through non-conductive yarn 38 and may terminate to form part of an outer layer of textile article 30. Both conductive paths 44 and 46 may have ends 50 and 52 that form part of the outer layer of textile article 30. Conductive paths 44 and 46 may be knitted on the outer layer of textile article 30 to define electrical connection points.

As depicted in FIG. 7B, solder paste 54 may be applied at ends 50 and 52. Solder paste 54 may be applied using soldering machine 23 or another soldering machine. Following application of solder paste 54, one or more electronic devices may be placed on textile article 30. Material handling robot 28 may be used to place electronic devices on textile article 30. As depicted, sensor 48 may be placed on textile article 30. Conductive layers 56 may be placed on electrical terminals of sensor 48 such that conductive layers 56 engage solder paste 54 when placed on textile article 30. Alternatively, conductive layers 56 may be placed on ends 50 and 52 of conductive paths 44 and 46 before placement of sensor 48. Conductive layers 56 may be one or more layers of copper tape. In another embodiment, conductive layers 56 may be one or more layers of conductive glue.

In some embodiments, before placement of sensor 48 on textile article 30, sensor 48 may undergo an overmolding process. FIG. 8 illustrates an embodiment in which sensor 48 is overmolded. Overmolding may include covering sensor 48 with protective material such as a thermoplastic. For instance, sensor 48 may be coated with Technomelt®. Technomelt® can be used in low pressure molding processes, making it compatible for use with electronic devices as the temperature and pressure are low enough to not damage the components of the electronic device. The computer-readable instructions may define instructions for an overmolding machine used to enclose sensor 48 in thermoplastic casing 39. Terminals connected to sensor 48 may protrude through casing 39 to allow connection with conductive paths 44 and 46. Overmolding sensor 48 may protect sensor 48 from water damage. Overmolding may also provide strain relief between wires or terminals of sensor 48 and conductive paths 44 and 46 that may be electrically connected to the terminals.

Following the placement of sensor 48 on textile article 30, high-frequency ultrasonic acoustic vibration may be applied at ends 50 and 52 of conductive paths 44 and 46 to melt solder paste 54 and conductive material 56 to create a bond between conductive paths 44, 46 and sensor 48. Welding machine 24 or another welding machine may be used to apply high-frequency ultrasonic acoustic vibration to ends 50 and 52 of conductive paths 44 and 46. Conductive paths 44, 46 and sensor 48 may be resistant to separation after the bond is formed (e.g., in the presence of forces typical of wearing a textile article 30, washing or otherwise handling the textile article 30).

Figure 9A:
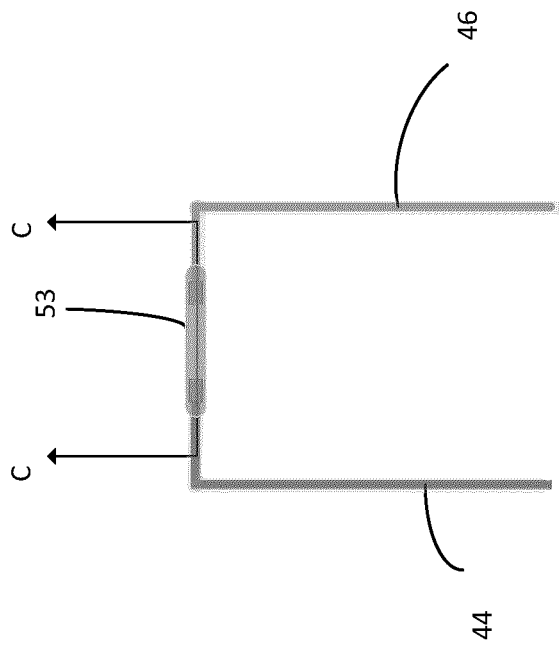
FIG. 9A depicts a top plan view of conductive paths, a controller, and a sensor that is overmolded with material and affixed to a textile article, in accordance with an embodiment.
Figure 9B:
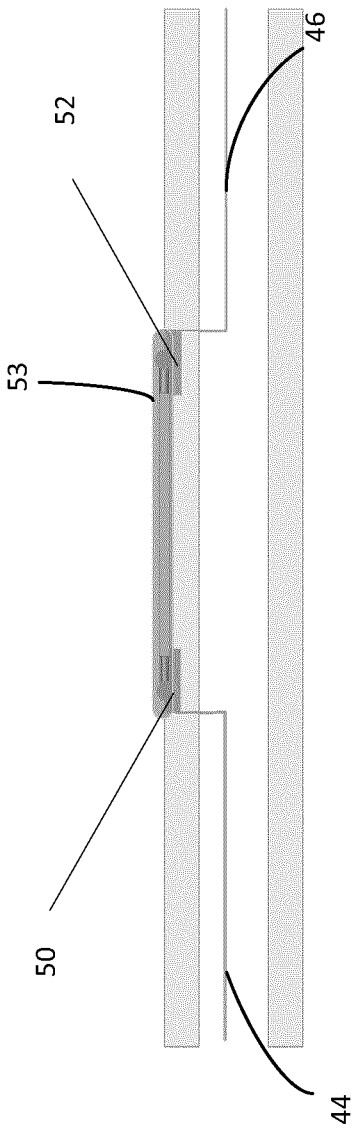
FIG. 9B depicts a cross-sectional view of a portion of a textile article taken at C-C of FIG. 9A, in accordance with an embodiment.

In some embodiments, following placement of sensor 48 on textile article 30 and after applying high-frequency ultrasonic acoustic vibration to ends 50 and 52 of conductive paths 44 and 46, sensor 48 may be overmolded to fix sensor 48 to textile article 30. FIG. 9A depicts a top plan view of conductive paths, controller 49, and sensor 48 that is overmolded with material and affixed to textile article 30. FIG. 9B depicts a cross-sectional view of a portion of textile article 30 taken at C-C of FIG. 9A. Sensor 48 may be overmolded with Technomelt®, for example, prior to placement on textile article 30. Overmolding sensor 48 to fix sensor 48 to textile article 30 may include injecting a flexible elastomer material 53 in liquid form on sensor 48 and textile article 30. Elastomer 53 may adhere to textile article 30 creating an inseparable assembly which is water-resistant. Elastomer 53 may be a thermoplastic elastomer (TPE) or a two part silicone epoxy. For example, elastomer 53 may be Dynaflex® G7970-1001-00 or Dynaflex® G7930-9001-00. Elastomer 53 may be applied at a temperature lower than the melting temperature of the yarn. Adhesion of elastomer 53 to textile article 30 may include mechanical adhesion. To encourage adhesion of elastomer 53 to textile article 30, textile article 30 may be pre-stretched to open up the knitted structure allowing some elastomer material to flow through openings in the interknitted yarn creating a mechanical interlock when elastomer material 53 is hardened. Textile article 30 can also be knit to have an open structure which allows some elastomer material to flow through openings in the interknitted yarn creating a mechanical interlock when elastomer material 53 is hardened. Elastomer 53 may provide strain relief between terminals of sensor 48 and conductive paths 44 and 46 that may be electrically connected to the terminals. Elastomer 53 is flexible and may be capable of absorbing energy when textile article 30 is subjected to loading.

In alternative embodiments, yarn may be made of a material have a melting temperature similar to elastomer 53. Elastomer 53 may be injected on textile article 30 at a melting temperature of yarn to create a chemical bond between elastomer 53 and textile article 30.

In some cases, after sensor 48 has been placed on textile article 30 and before injecting the elastomer 53 on sensor 48 and textile article 30, electromagnetic shielding may be applied to sensor 48. Electromagnetic shielding may include covering sensor 48 with a conductive layer of material to isolate sensor 48 from the surroundings.

Figure 10:
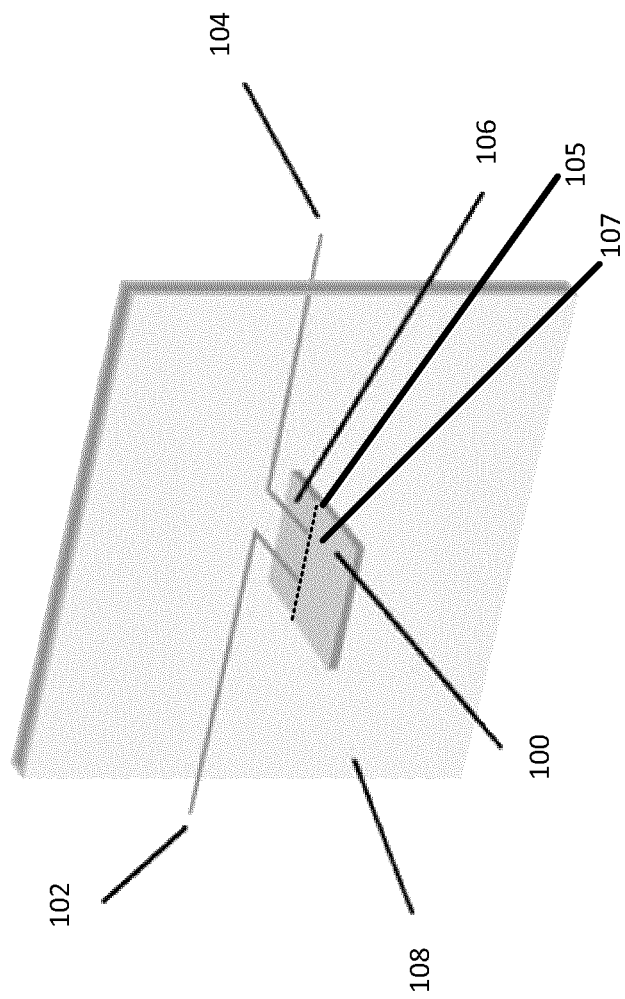
FIG. 10 depicts a conductive tab, in accordance with an embodiment.

FIG. 10 depicts a tab 100, which may be formed at a junction between two or more conductive paths, to facilitate establishment of a bond between the paths. Such a bond, for example, connects the conductive paths for electrical communication.

In the depicted embodiment, tab 100 is formed at a junction between conductive paths 102 and 104, and facilitates establishment of a bond between conductive paths 102 and 104.

Each of conductive paths 102 and 104 includes a conductive yarn. Tab 100 may be formed by knitting the yarn of conductive paths 102 and 104 together, e.g., in a striped fashion. In other embodiments, other manners of joining conductive paths 102 and 104 to form tab 100 may be used.

Since tab 100 is formed from conductive paths 102 and 104, tab 100 electrically conductive in at least a portion thereof. As such, tab 100 may be referred to as a "conductive tab".

Tab 100 is formed to extend from a surface of textile article 30, e.g., from a base material 108 of textile article 30. Base material 108 may correspond to an inner textile surface of textile article 30, or an outer textile surface of textile article 30. When textile article 30 is formed of multiple layers, base material 108 may correspond to any of those layers. In some embodiments, tab 100 may include a portion 106 flush to base material 108 and a portion 107 that extends from base material 108. The extended portion forms a flap that can be folded about a seam 105.

Tab 100 may be formed into any size suitable for providing a junction and for placement of any required electronic devices (such as a PCB) thereon. In some embodiments, tab 100 may, for example, have a width of 1-5 mm and a length of 1-5 mm, and have a thickness of 0.1-2 mm. Of course, the size and thickness of tab 100 may differ from embodiment to embodiment. For example, in some embodiments, the width and/or length may be greater than 5 mm, e.g., 10 mm, 20 mm, or the like.

FIG. 11 shows the use of tab 100 during an example method for manufacturing a textile article. FIG. 11 includes a cross-sectional view of a portion of a textile article 30. As shown, textile article 30 may be formed using base material 108 including two outer layers defining an inlay channel. The outer layers may be formed substantially from non-conductive yarn. Conductive paths 102 and 104 pass through the inlay channel. As shown, conductive paths 102 and 104 are knitted together to form tab 100, which protrudes out of the inlay channel and through the base material 108.

During manufacturing, solder paste 110 may be applied to tab 100, e.g., by soldering machine 23. An electronic device 112 is placed on top of solder paste 110, e.g., by material handling robot 28. Electronic device 112 may be a printed circuit board, for example, but could any type of electronic device. A bond is formed at tab 100 to join electronic device 112 and conductive paths 102 and 104 for electrical communication. This bond may be formed, for example, by a welding machine 24. In the depicted embodiment, welding machine 24 includes a hotbar 114 that applies heat and pressure to electronic device 112 to melt solder paste 110 and press electronic device 112 to solder paste 110 and conductive paths 102 and 104. In other embodiments, the bond can be formed using ultrasonic welding, laser beam welding, spot welding, or the like.

In some embodiments, hotbar 114 is a pulsed heat thermode. This thermode may be used in a pulse bonding process to heat and cause two or more components (which may be pre-fluxed or adhesive coated) to melt and solidify, thereby forming a electromechanical bond. In a specific embodiment, the pulsed heat thermode attached to a newhorizon™ hotbar machine provided by Amada Weldtech. As will be appreciated, the particular thermode used may vary from application to application, e.g., depending on the type of connection desired and what is being connected. Similarly, the working temperature of hot bar 114 may varying depending on the type of connection desired and what is being connected. In some embodiments, the working temperature of hot bar 114 is between approximately 150-350 degrees Celsius. In other embodiments, the working temperature may be higher or lower.

Conveniently, the use of tab 100 provides separation between a junction location where soldering, welding and other steps described herein are applied, and the remainder of a textile article 30 (e.g., base material 108). In this way, heat, pressure, acoustic vibration, or other energy applied to the tab is separated from the remainder of a textile article 30. This separation may help avoid damage to portions of textile article 30 such as base material 108.

In some embodiments, an overmolding process described herein may be applied to tab 100, to cover electronic device 112 with protective material. In some embodiments, the overmolding process may substantially cover tab 100.

Figure 12:
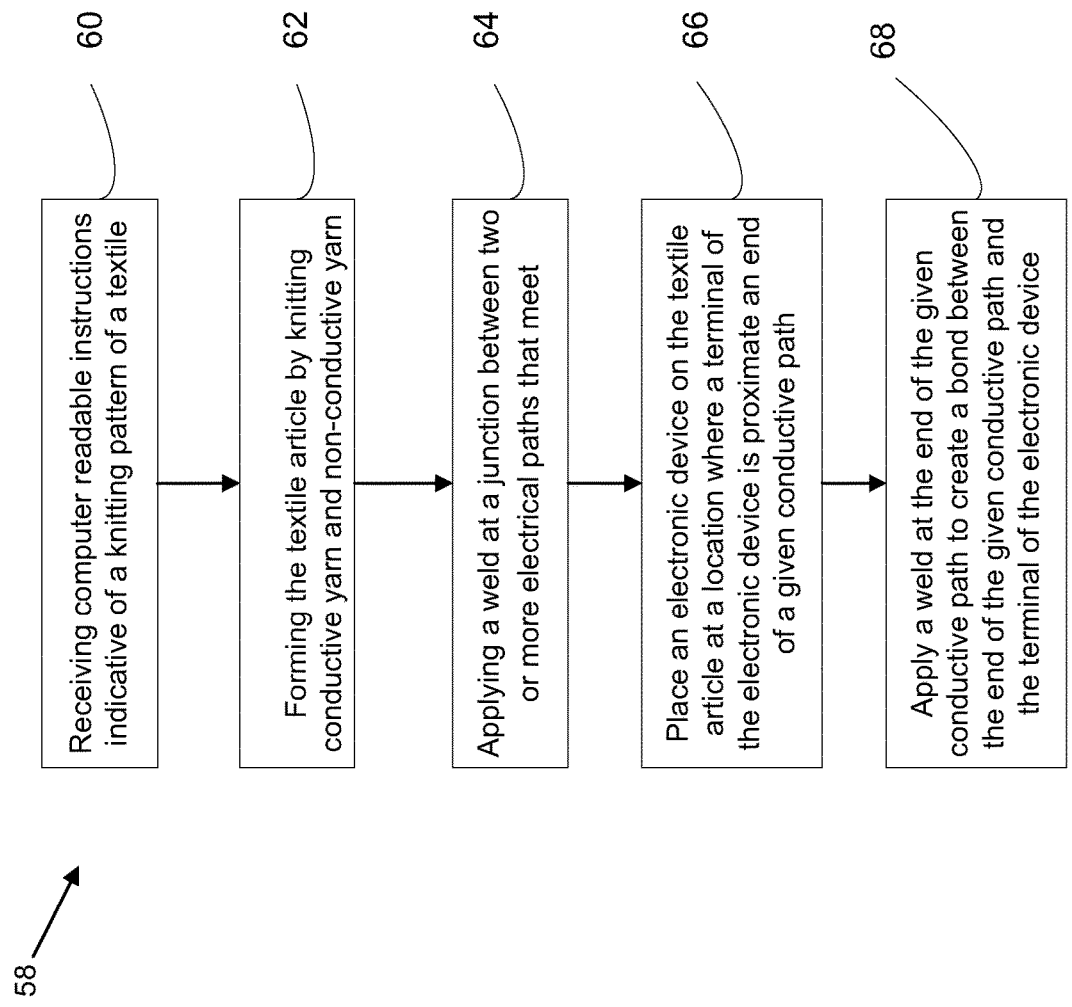
FIG. 12 is a flowchart illustrating an example method for manufacturing a textile article having conductive yarn and an integrated electronic device.

FIG. 12 is a flowchart illustrating an example computer aided method 58 for manufacturing a textile article (e.g., textile article 30) having electrically conductive yarn and an electronic device, in accordance with an embodiment. Method 58 can be performed using system 10 described herein or using another system. It is understood that aspects of method 58 can be combined with aspects of other methods described herein. In various embodiments, method 58 includes:

receiving computer-readable instructions indicative of a knitting pattern of the textile article (see block 60), the knitting pattern defining:
- an arrangement of conductive yarn and non-conductive yarn in the textile article, the conductive yarn arranged to provide a plurality of conductive paths;
- a location of a junction where two or more of the plurality of conductive paths meet; and
- a location of an end of a given one of the conductive paths; and processing the computer-readable instructions and in accordance with the instructions:
- form the textile article by knitting the conductive yarn and the non-conductive yarn (see block 62);
- apply a weld at the junction to create a bond between the conductive paths that meet at the junction (see block 64);
- place the electronic device on the textile article at a location where a terminal of the electronic device is proximate the end of the given conductive path (see block 66); and
- apply a weld at the end of the given conductive path to create a bond between the end of given conductive path and the terminal of the electronic device (see block 68).

Applying a weld at the junction may include applying high-frequency ultrasonic acoustic vibration at the junction to create the bond between the conductive paths that meet at the junction. In some embodiments, applying a weld at the junction may include applying solder paste at the junction and placing a thin layer of conductive material at the junction. Applying high-frequency ultrasonic acoustic vibration at the junction melts the conductive material and the solder paste.

Applying a weld at the end of the given conductive path may include applying high-frequency ultrasonic acoustic vibration at the end of the given conductive path. In some embodiments, applying a weld at the end of the given conductive path may include applying solder paste at the end of the given conductive path and placing a conductive material at the end of the given conductive path. Applying high-frequency ultrasonic acoustic vibration at the end of the given conductive path melts the conductive material and the solder paste.

In some embodiments, method 58 may include sewing the textile article to be of the desired shape as defined in the computer-readable instructions.

In some embodiments, method 58 may include overmolding the electronic device with a thermoplastic adhesive before placing the electronic device on the textile article.

In some embodiments, method 58 may include injecting a flexible elastomer material in liquid form on the electronic device and the textile article to affix the electronic device to the textile article.

The above description is meant to be exemplary only, and one skilled in the relevant arts will recognize that changes may be made to the embodiments described without departing from the scope of the invention disclosed. The present disclosure may be embodied in other specific forms without departing from the subject matter of the claims. The present disclosure is intended to cover and embrace all suitable changes in technology. Modifications which fall within the scope of the present invention will be apparent to those skilled in the art, in light of a review of this disclosure, and such modifications are intended to fall within the appended claims. Also, the scope of the claims should not be limited by the preferred embodiments set forth in the examples, but should be given the broadest interpretation consistent with the description as a whole.

What is claimed is:

1. A computer-aided method for manufacturing a textile article having electrically conductive yarn and an integrated electronic device, the method comprising:
   receiving computer-readable instructions indicative of a knitting pattern of the textile article, the knitting pattern defining:
   an arrangement of conductive yarn and non-conductive yarn in the textile article, the conductive yarn arranged to provide a plurality of conductive paths;
   a location of a junction where two or more of the plurality of conductive paths meet; and
   a location of an end of a given one of the conductive paths; and
   processing the computer-readable instructions and in accordance with the instructions:
   form the textile article by knitting the conductive yarn and the non-conductive yarn;
   apply a weld at the junction to create a bond between the conductive paths that meet at the junction;
   place the electronic device on the textile article at a location where a terminal of the electronic device is proximate the end of the given conductive path; and
   apply a weld at the end of the given conductive path to create a bond between the end of given conductive path and the terminal of the electronic device.

2. The method of claim 1, wherein the textile article is formed to include a plurality of layers including at least two outer layers and an inlay channel between the two outer layers.

3. The method of claim 2, wherein the junction and the end of the given conductive path are formed on one of the outer layers of the textile article.

4. The method of claim 2, wherein at least a portion of the conductive paths are formed within the inlay channel and is covered by non-conductive yarn of the outer layers.

5. The method of claim 1, further comprising: knitting conductive yarn of at least two of the conductive paths to form a tab that extends from a surface of the textile article.

6. The method of claim 5, wherein the junction is located at the tab.

7. The method of claim 6, wherein the bond is formed between the electronic device and the tab.

8. The method of claim 1, wherein applying the weld at the junction comprises applying high-frequency ultrasonic acoustic vibration at the junction to create the bond between the conductive paths that meet at the junction.

9. The method of claim 8 further comprising:
   applying solder paste at the junction;
   placing a layer of conductive material at the junction; and
   wherein the applying high-frequency ultrasonic acoustic vibration melts the conductive material and the solder paste.

10. The method of claim 1, wherein applying the weld at the end of the given conductive path comprises applying high-frequency ultrasonic acoustic vibration at the end of the given conductive path.

11. The method of claim 10 further comprising:
applying solder paste at the end of the given conductive path;
placing a conductive material at the end of the given conductive path; and
wherein the applying high-frequency ultrasonic acoustic vibration melts the conductive material and the solder paste.

12. The method of claim 1, wherein the computer-readable instructions further comprise sewing instructions defining a desired shape, and the method further comprises sewing the textile article to be of the desired shape.

13. The method of claim 1, wherein the computer-readable instructions further comprises instructions that define an overmolding process used to enclose the electronic device in a thermoplastic casing.

14. The method of claim 1, wherein the computer-readable instructions further comprises instructions that define an overmolding process that includes injecting a flexible elastomer material in liquid form on the electronic device and the textile article to affix the electronic device to the textile article.

15. A system for manufacturing a textile article having conductive yarn and an integrated electronic device, the system comprising:
a knitting machine;
at least one ultrasonic welding machine;
a material handling robot;
one or more processors;
non-transitory machine-readable memory storing instructions executable by the one or more computer processors and configured to cause the one or more computer processors to:
receive manufacturing instructions indicative of a knitting pattern of the textile article, the knitting pattern defining:
an arrangement of conductive yarn and non-conductive yarn in the textile article, the conductive yarn arranged to provide a plurality of conductive paths;
a location of a junction where two or more of the plurality of conductive paths meet; and
a location of an end of a given one of the conductive paths; and
process the manufacturing instructions and in accordance with the manufacturing instructions:
determine first operating parameters for the knitting machine, second operating parameters for the at least one welding machine, third operating parameters for the material handling robot, and fourth operating parameters for the at least one welding machine;
configure the knitting machine to form the textile article by knitting the conducting yarn and the non-conductive yarn when operating under the first operating parameters;
configure the at least one welding machine to apply high-frequency ultrasonic acoustic vibration at the junction when operating under the second operating parameters;
configure the material handling robot to place the electronic device on the textile article at a location where a terminal of the electronic device is proximate the end of a given one of the conductive paths when operating under the third operating parameters; and
configure the at least one welding machine to apply a weld at the junction to create a bond between the terminal of the electronic device and the given one of the conductive paths when operating under the fourth operating parameters.

16. The system of claim 15, wherein the at least one welding machine is configured to create the bond by applying high-frequency ultrasonic acoustic vibration.

17. The system of claim 15 further comprising:
at least one machine configured to apply solder paste at the junction and to place conductive material on the solder paste.

18. The system of claim 17, wherein the at least one welding machine is configured to melt the solder paste to form a bond between the two or more conductive paths that meet at the junction.

19. The system of claim 15, further comprising:
at least one machine configured to apply solder paste at the end of a given one of the conductive paths and to place conductive material on the solder paste.

20. The system of claim 15 further comprising:
a laser configured to emit high intensity light to at least partially remove insulating material coating the conducting yarn.

* * * * *